United States Patent
Shiu et al.

(10) Patent No.: US 9,344,148 B2
(45) Date of Patent: May 17, 2016

(54) INPUT/OUTPUT SIGNAL PROCESSING CIRCUIT AND INPUT/OUTPUT SIGNAL PROCESSING METHOD

(71) Applicants: Yi-Min Shiu, Chupei (TW); Chao-Chi Chen, Chupei (TW); Pei-Sheng Tsu, Chupei (TW)

(72) Inventors: Yi-Min Shiu, Chupei (TW); Chao-Chi Chen, Chupei (TW); Pei-Sheng Tsu, Chupei (TW)

(73) Assignee: RICHTEK TECHNOLOGY CORPORATION, Chupei, Hsinchu (TW)

( * ) Notice: Subject to any disclaimer, the term of this patent is extended or adjusted under 35 U.S.C. 154(b) by 0 days.

(21) Appl. No.: 14/755,686

(22) Filed: Jun. 30, 2015

(65) Prior Publication Data

US 2016/0020825 A1    Jan. 21, 2016

Related U.S. Application Data

(60) Provisional application No. 62/025,284, filed on Jul. 16, 2014.

(51) Int. Cl.
| | |
|---|---|
| H03K 9/06 | (2006.01) |
| H04B 3/54 | (2006.01) |
| G11C 5/14 | (2006.01) |
| G11C 11/4096 | (2006.01) |
| G11C 11/4074 | (2006.01) |

(52) U.S. Cl.
CPC .......... *H04B 3/54* (2013.01); *G09G 2300/0408* (2013.01); *G09G 2310/0289* (2013.01); *G11C 5/14* (2013.01); *G11C 11/4074* (2013.01); *G11C 11/4096* (2013.01)

(58) Field of Classification Search
CPC .. G11C 5/14; G11C 11/4074; G11C 11/4096; G09G 2300/0408; G09G 2310/0289
USPC .............. 375/257; 365/226, 230.06; 345/204; 326/62
See application file for complete search history.

(56) References Cited

U.S. PATENT DOCUMENTS

| | | | | |
|---|---|---|---|---|
| 6,590,553 | B1 * | 7/2003 | Kimura ................ | G09G 3/3651 345/204 |
| 2006/0208975 | A1 * | 9/2006 | Ono ..................... | G09G 3/3233 345/76 |
| 2008/0174287 | A1 * | 7/2008 | Park ...................... | H02M 3/158 323/271 |
| 2009/0316741 | A1 * | 12/2009 | Watanabe .......... | G05D 23/1906 372/34 |
| 2012/0200611 | A1 * | 8/2012 | Matsui ................ | G09G 3/3233 345/690 |
| 2013/0154506 | A1 * | 6/2013 | Ebisuno ................ | H05B 33/08 315/294 |

\* cited by examiner

*Primary Examiner* — Leila Malek
(74) *Attorney, Agent, or Firm* — Tung & Associates

(57) ABSTRACT

The present invention discloses an input/output (I/O) signal processing circuit and processing method. The I/O signal processing circuit includes a level adjustable I/O circuit and an adjustment circuit. The I/O signal processing circuit includes an output driver and/or an input comparator. The output driver transmits an output signal via a signal transmission line according to an output data. The output driver has an adjustable high operation voltage level and an adjustable low operation voltage level, which determine a high level and a low level of the output signal, respectively. The input comparator receives an input signal via the signal transmission line and comparing the input signal with an adjustable reference voltage, so as to generate an input data. The adjustment circuit generates an adjustment signal according to voltage drop related information, to correspondingly adjust the adjustable high and low operation voltage level and/or the adjustable reference voltage.

10 Claims, 6 Drawing Sheets

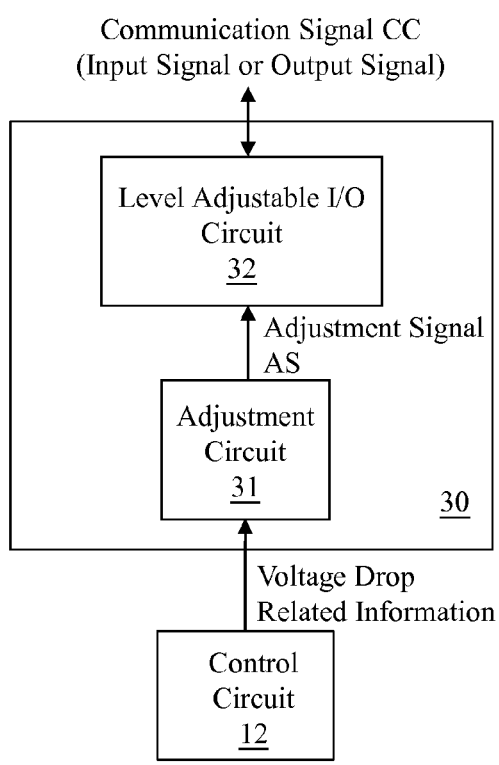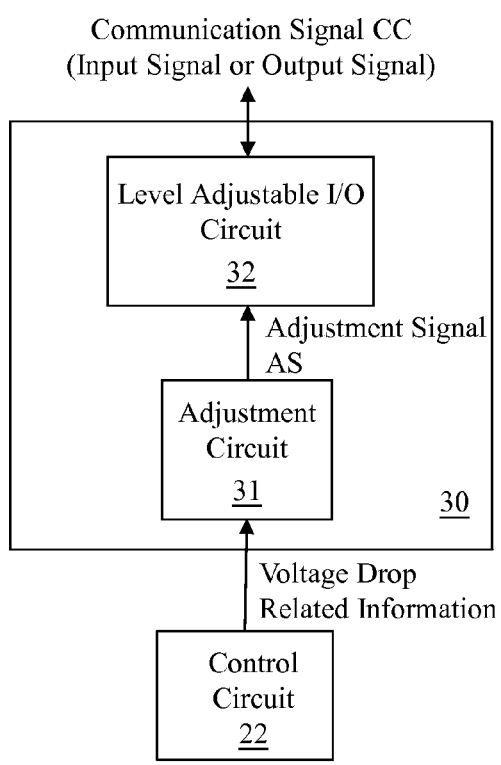
Fig. 3A                    Fig. 3B

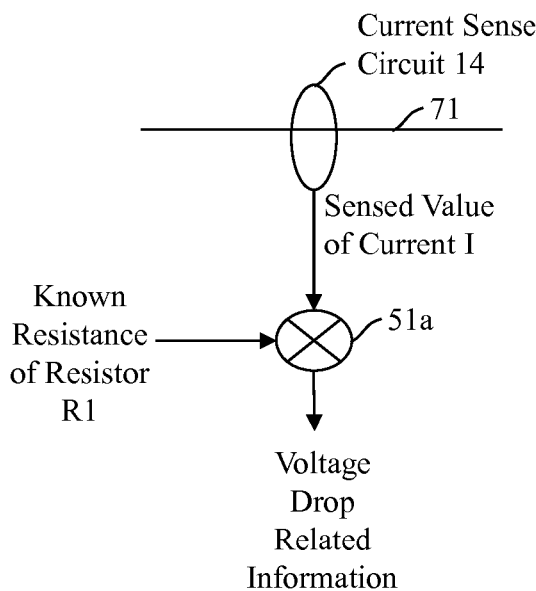
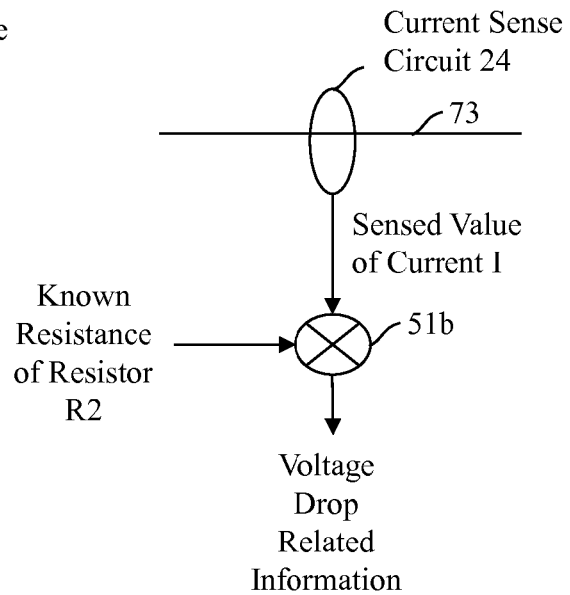
Fig. 7A    Fig. 7B
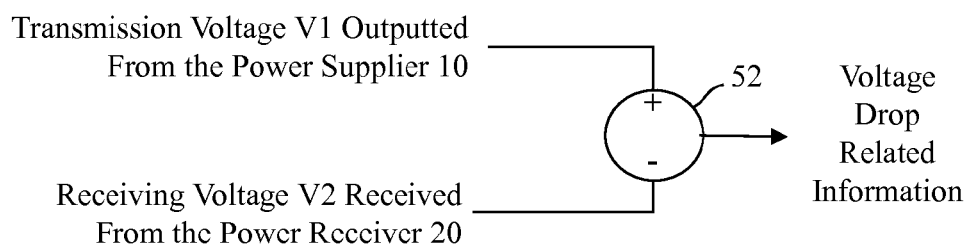
Fig. 8

INPUT/OUTPUT SIGNAL PROCESSING CIRCUIT AND INPUT/OUTPUT SIGNAL PROCESSING METHOD

CROSS REFERENCE

The present invention claims priority to U.S. 62/025,284, filed on Jul. 16, 2014.

BACKGROUND OF THE INVENTION

1. Field of Invention

The present invention relates to an input/output (I/O) signal processing circuit and an I/O signal processing method; particularly, it relates to such an I/O signal processing circuit having a level adjustable I/O circuit and a corresponding I/O processing method.

2. Description of Related Art

Please refer to FIG. 1, which shows a block diagram of a conventional power supply system. The conventional power supply system 100 comprises a power supplier 10 which is for example a power adaptor, a cable 70 and a power receiver 20 which is for example an electronic device. The power adaptor 10 and the electronic device 20 are coupled to each other through the cable 70. The power adaptor 10 includes a power converter 11, a control circuit 12 and an input/output (I/O) circuit 62A. The control circuit 12 controls an operation of the power converter 11, and receives as well as transmits signals via the I/O circuit 62A. The electronic device 20 includes a load 21, a control circuit 22 and an I/O circuit 62B. The control circuit 22 controls an operation of the load 21 and receives as well as transmits signals via the I/O circuit 62B. The cable 70 includes a positive power transmission line 71, a negative power transmission line 73 and a signal transmission line 72. When the power adaptor 10 (as a power supplier) and the electronic device 20 (as a power receiver) are coupled to each other through the cable 70, the positive power transmission line 71 and the negative power transmission line 73 form a loop to transmit power. The signal transmission line 72 can transmit data (i.e., a communication signal CC) between a terminal CC1 of the power adaptor 10 and a terminal CC2 of the electronic device 20.

As shown in FIG. 1, because the positive power transmission line 71 has a parasitic resistance (represented by a resistor R1), when the power adaptor 10 supplies a current I through the positive power transmission line 71, there will be a voltage drop across the resistor R1. That is, there will be a voltage difference between the voltage VA and the voltage VB. Similarly, because the negative power transmission line 73 also has a parasitic resistance (represented by a resistor R2), there will be a voltage drop across the resistor R2 as the current I flows through the negative power transmission line 73. That is, there will be a voltage difference between the grounding terminal GNDA and the grounding terminal GNDB. As a consequence, the level of the communication signal CC will be inaccurate due to the unwanted level difference between the voltage VA and the voltage VB and the unwanted level difference between the grounding terminal GNDA and the grounding terminal GNDB. For example, a digital signal "1" might be misinterpreted as "0" because the communication signal CC has a voltage level which is too low relatively to the grounding level; or, a digital signal "0" might be misinterpreted as "1" because the communication signal CC has a voltage level which is too high relatively to the grounding level.

In view of the above, to overcome the drawbacks in the prior art, the present invention proposes an I/O signal processing circuit and an I/O signal processing method, which are capable of providing an accurate communication signal CC via a level adjustable I/O circuit.

SUMMARY OF THE INVENTION

From one perspective, the present invention provides an input/output (I/O) signal processing circuit for signal transmission between a power supplier and a power receiver, wherein the power supplier and the power receiver are connected to each other through a cable, the cable including positive and negative power transmission lines and a signal transmission line, the I/O signal processing circuit being used for receiving an input signal or transmitting an output signal via the signal transmission line, the I/O signal processing circuit comprising: a level adjustable input/output (I/O) circuit, which includes: an output driver for transmitting the output signal via the signal transmission line according to an output data, the output driver having an adjustable high operation voltage level and an adjustable low operation voltage level, wherein the adjustable high operation voltage level determines a high level of the output signal and the adjustable low operation voltage level determines a low level of the output signal; and/or an input comparator for receiving the input signal via the signal transmission line and comparing the input signal with an adjustable reference voltage, so as to generate an input data; and an adjustment circuit for generating an adjustment signal according to voltage drop related information which is related to a voltage drop across the positive or negative power transmission line, so as to correspondingly adjust the adjustable high operation voltage level and the adjustable low operation voltage level and/or to correspondingly adjust the adjustable reference voltage.

In one embodiment, the voltage drop related information is generated by a voltage drop information generation circuit, the voltage drop information generation circuit including a multiplier, which determines the voltage drop related information based upon a product of multiplication of a predetermined resistance multiplied by a sensed value of a current flowing through the positive or negative power transmission line.

In one embodiment, the voltage drop related information is generated by a voltage drop information generation circuit, the voltage drop information generation circuit including a subtractor circuit, which determines the voltage drop related information based upon a difference between a transmitted voltage outputted from the power supplier and a received voltage received by the power receiver.

In one embodiment, the I/O signal processing circuit is located within the power supplier and the I/O signal processing circuit receives information related to the received voltage from the power receiver via the signal transmission line.

In one embodiment, the I/O signal processing circuit is located within the power receiver and the I/O signal processing circuit receives information related to the transmitted voltage from the power supplier via the signal transmission line.

From another perspective, the present invention provides an input/output (I/O) signal processing method for a signal transmitted between a power supplier and a power receiver, wherein the power supplier and the power receiver are connected to each other through a cable, the cable including positive and negative power transmission lines and a signal transmission line, the I/O signal processing method comprising the steps of: receiving an input signal or transmitting an output signal between the power supplier and the power receiver via the signal transmission line, wherein a high level of the output signal is determined by an adjustable high operation voltage level and a low level of the output signal is determined by an adjustable low operation voltage level, and the input signal is compared with an adjustable reference voltage; and generating an adjustment signal according to voltage drop related information which is related to a voltage drop across the positive or negative power transmission line, so as to correspondingly adjust the adjustable high operation voltage level and the adjustable low operation voltage level, and/or to correspondingly adjust the adjustable reference voltage.

In one embodiment, the voltage drop related information is determined according to a product of multiplication of a predetermined resistance multiplied by a sensed value of a current flowing through the positive or negative power transmission line.

In one embodiment, the voltage drop related information is determined according to a difference between a transmitted voltage outputted from the power supplier and a received voltage received by the power receiver.

In one embodiment, the I/O signal processing method further comprising: receiving information related to the received voltage from the power receiver via the signal transmission line.

In one embodiment, the I/O signal processing method further comprising: receiving information related to the transmitted voltage from the power supplier via the signal transmission line.

The objectives, technical details, features, and effects of the present invention will be better understood with regard to the detailed description of the embodiments below, with reference to the attached drawings.

BRIEF DESCRIPTION OF THE DRAWINGS

FIGS. 3A-3B show embodiments as to how the I/O signal processing circuit 30 of the present invention adjusts a level of the input signal or a level of the output signal according to the voltage drop related information.

FIGS. 7A-7B show embodiments of a voltage drop information generation circuit of the present invention.

FIG. 8 shows another embodiment of a voltage drop information generation circuit of the present invention.

DESCRIPTION OF THE PREFERRED EMBODIMENTS

The above and other technical details, features and effects of the present invention will be will be better understood with regard to the detailed description of the embodiments below, with reference to the drawings. The drawings as referred to throughout the description of the present invention are for illustration only, to show the interrelations between the circuits and devices, but not drawn according to actual scale.

Figure 1:
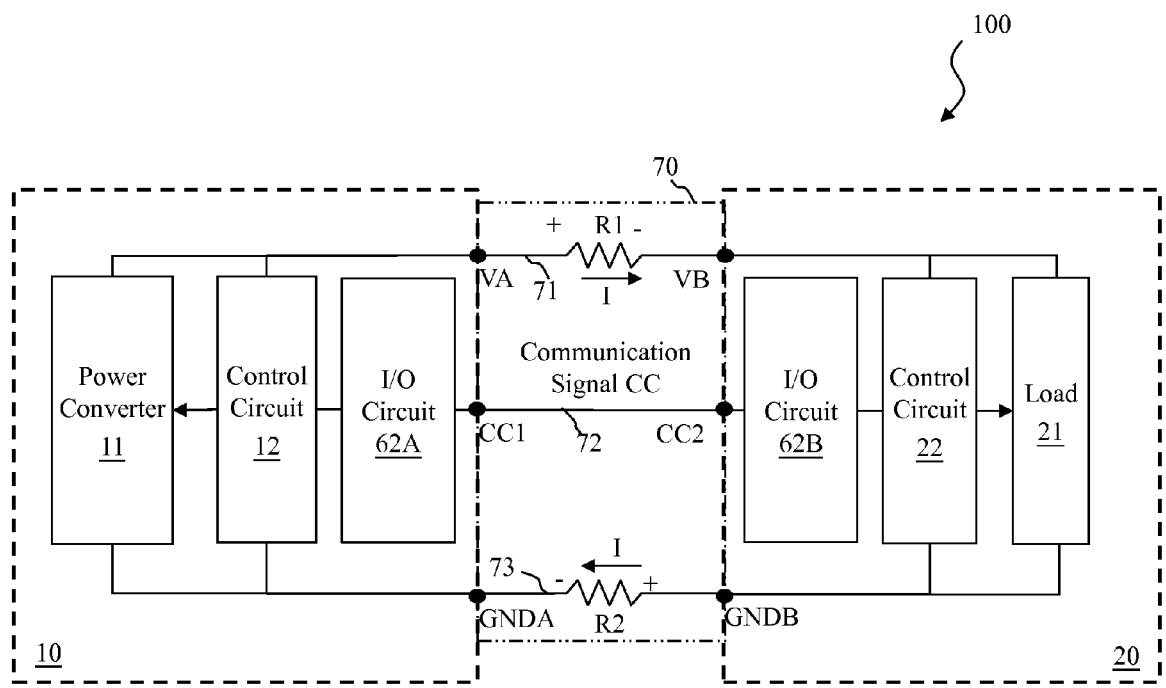
FIG. 1 shows a block diagram of a conventional power supply system.
Figure 2A:
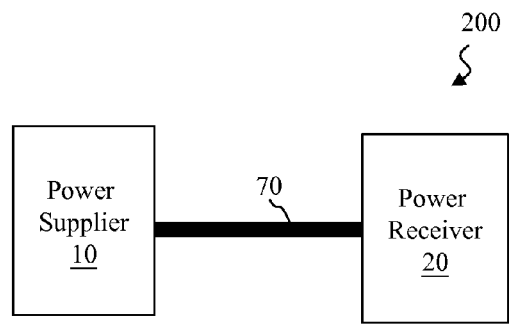
FIGS. 2A-2B show block diagrams of a power supply system according to an embodiment of the present invention.
Figure 2B:
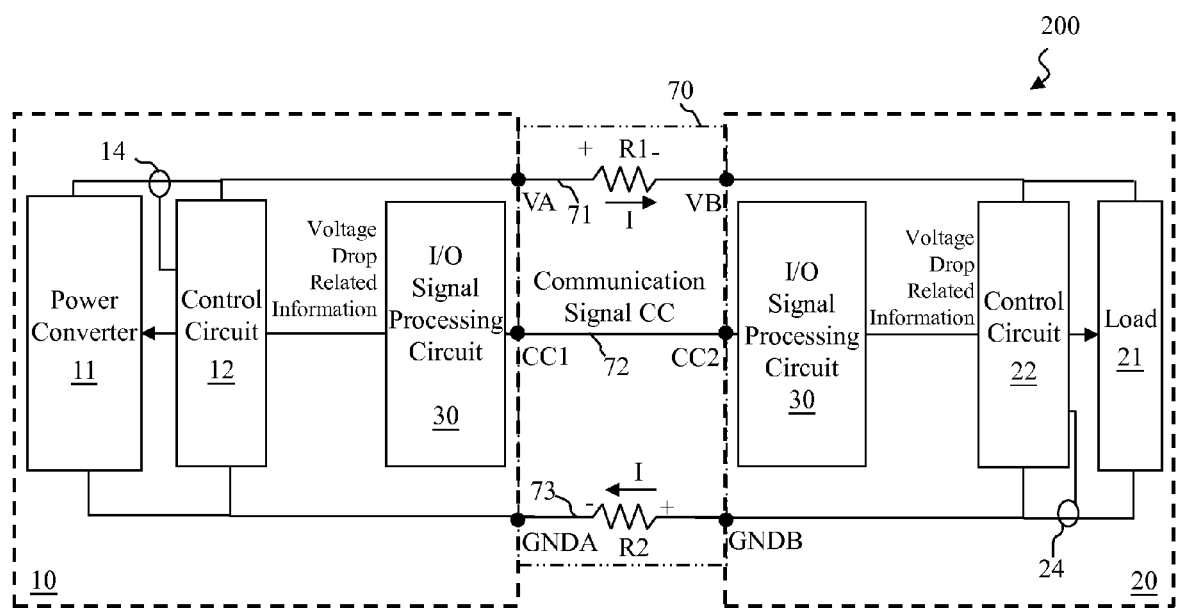

Please refer to FIGS. 2A-2B, which show block diagrams of a power supply system according to an embodiment of the present invention. As shown in FIG. 2A, the power supply system 200 comprises a power supplier 10, a cable 70 and a power receiver 20. The power supplier 10 and the power receiver 20 are coupled to each other through the cable 70. As shown in FIG. 2B, in one embodiment, the power supplier 10 for example can be, but is not limited to, a power adaptor 10 (hereafter the power adaptor 10 will be used as an example to represent the power supplier 10). The power receiver 20 for example can be, but is not limited to, an electronic device 20 (hereafter the electronic device 20 will be used as an example to represent the power receiver 20).

The power adaptor 10 includes a power converter 11, a control circuit 12 and an input/output (I/O) signal processing circuit 30. The control circuit 12 controls an operation of the power converter 11 and receives as well as transmits signals via the I/O signal processing circuit 30. The power converter 11 can be any type of power regulator, such as a switching power regulator. The present invention can be applied to and is not limited to any type of the power converter.

The electronic device 20 includes a load 21, a control circuit 22 and an input/output (I/O) signal processing circuit 30. The control circuit 22 controls an operation of the load 21 and receives as well as transmits signals via the I/O signal processing circuit 30.

The cable 70 includes a positive power transmission line 71, a negative power transmission line 73 and a signal transmission line 72. When the power adaptor 10 (as a power supplier) and the electronic device 20 (as a power receiver) are coupled to each other through the cable 70, the positive power transmission line 71 and the negative power transmission line 73 form a loop to transmit power. The signal transmission line 72 can transmit data (i.e., a communication signal CC) between a terminal CC1 of the power adaptor 10 and a terminal CC2 of the electronic device 20.

Please refer to FIGS. 3A-3B in conjugation with FIG. 2. FIGS. 3A-3B show embodiments as to how the I/O signal processing circuit 30 of the present invention adjusts a level of the input signal or a level of the output signal according to information related to voltage drop ("voltage drop related information" hereinafter). FIG. 3A shows that the I/O signal processing circuit 30 is located within the power adaptor 10, while FIG. 3B shows that the I/O signal processing circuit is located within the electronic device 20. In this embodiment, both the power adaptor 10 and the electronic device 20 are equipped with the I/O signal processing circuit 30, so both the power adaptor 10 and the electronic device 20 are capable of adjusting the level of the input signal or the level of the output signal. In another embodiment, the I/O signal processing circuit 30 can be provided only in the power adaptor 10, while the electronic device 20 does not include the I/O signal processing circuit 30 (the electronic device 20 may include the I/O circuit 62B in the prior art). Correspondingly, the power adaptor 10 will be the only device capable of adjusting the level of the input signal or the level of the output signal, whereas the electronic device 20 is not capable of adjusting the level of the input signal or the level of the output signal. Or, in yet another embodiment, the I/O signal processing circuit 30 can be provided only in the electronic device 20, while the power adaptor 10 does not include the I/O signal processing circuit 30 (the power adaptor 10 may include the I/O circuit 62A in the prior art). Correspondingly, the electronic device 20 will be the only device capable of adjusting the level of the input signal or the level of the output signal, whereas the power adaptor 10 is not capable of adjusting the level of the input signal or the level of the output signal.

As mentioned above, because the positive power transmission line 71 has a parasitic resistance (represented by the resistor R1), when the power adaptor 10 supplies a current I through the positive power transmission line 71, there will be a voltage drop across the resistor R1. That is, there will be a voltage difference between the voltage VA and the voltage VB. Similarly, because the negative power transmission line 73 also has a parasitic resistance (represented by the resistor R2), there will be a voltage drop across the resistor R2 as the current I flows through the negative power transmission line 73. That is, there will be a voltage difference between the grounding terminal GNDA and the grounding terminal GNDB. As a consequence, the level of the communication signal CC will be inaccurate due to the unwanted level difference between the voltage VA and the voltage VB and the unwanted level difference between the grounding terminal GNDA and the grounding terminal GNDB. To overcome this drawback, the present invention provides a solution.

The I/O signal processing circuit 30 receives and transmits a communication signal CC via the signal transmission line 72. This communication signal CC may be an input signal inputted through the I/O signal processing circuit 30 to an internal circuit or an output signal transmitted through the I/O signal processing circuit 30 to an external circuit. The I/O signal processing circuit 30 includes a level adjustable input/output (I/O) circuit 32 and an adjustment circuit 31. The adjustment circuit 31 can generate an adjustment signal AS according to the voltage drop related information related to a voltage difference between the voltage VA and the voltage VB, or the voltage drop related information related to a voltage difference between the grounding terminal GNDA and the grounding terminal GNDB. The voltage drop related information can be generated by for example but not limited to the control circuit 12 or 22, which will be described later. The level adjustable I/O circuit 32 can adjust the level of the communication signal CC (i.e., the level of the input signal or the output signal) according to the adjustment signal AS, so as to avoid misinterpretation of the communication signal CC because of inaccurate signal level.

Figure 4:
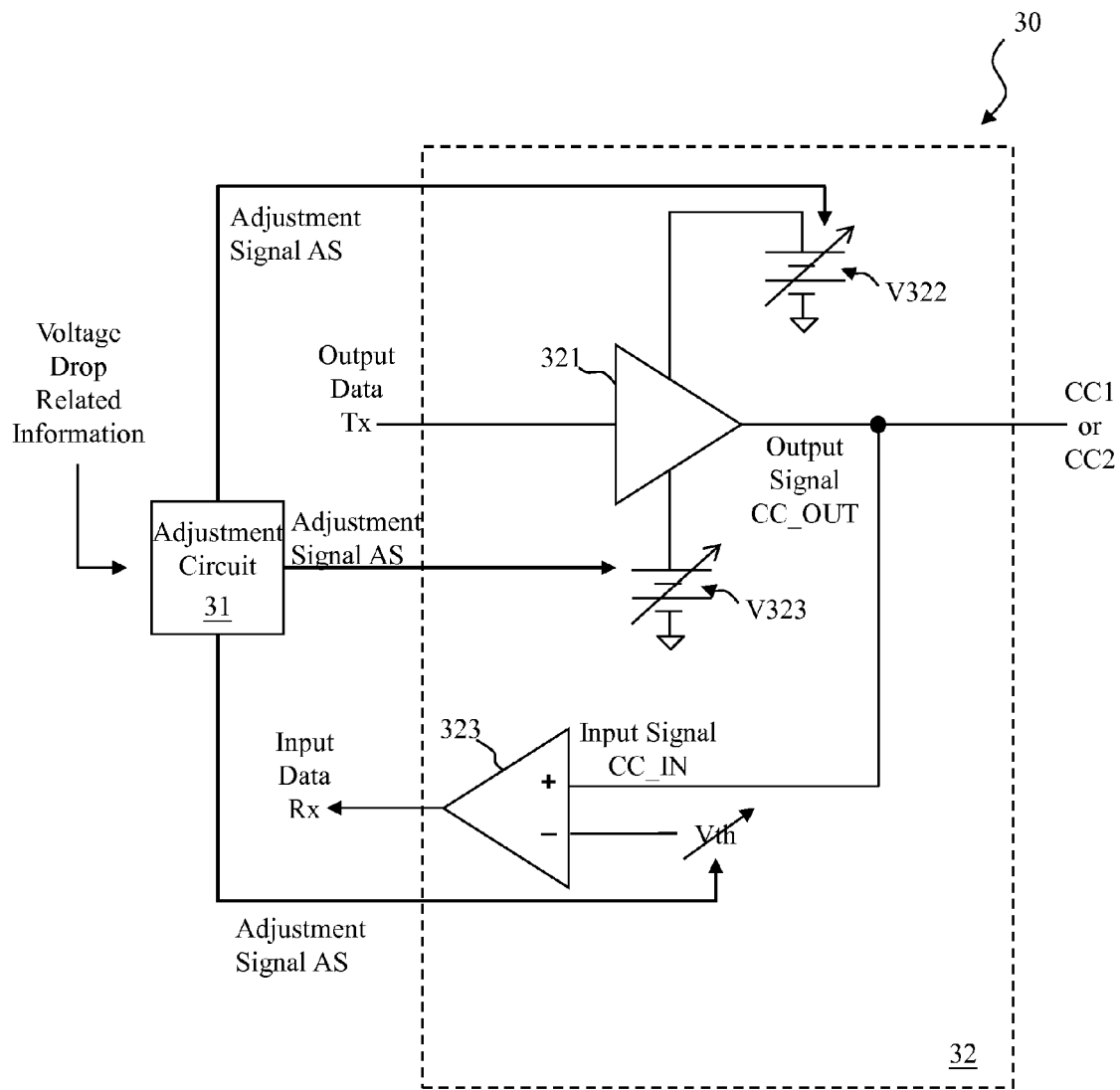
FIG. 4 shows an embodiment of a level adjustable I/O circuit.
Figure 5:
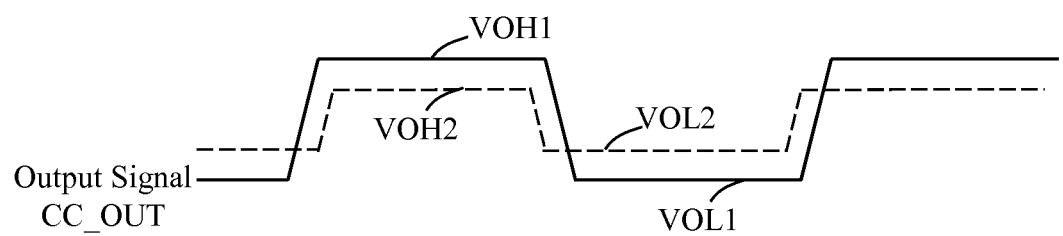
FIG. 5 shows that a high level and a low level of the output signal are adjustable.
Figure 6:
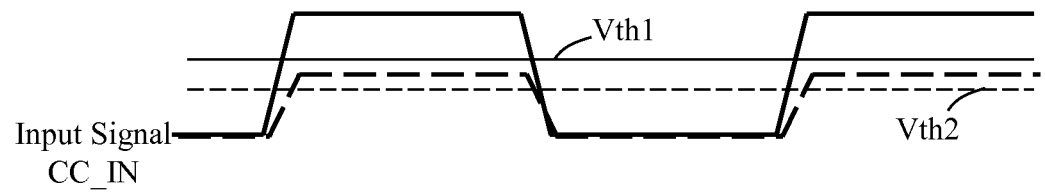
FIG. 6 shows that the adjustable reference voltage of the present invention is adjustable.

More specifically, please refer to FIG. 4 in conjugation with FIG. 5 and FIG. 6. FIG. 4 shows an embodiment of a level adjustable I/O circuit. FIG. 5 shows that a high level and a low level of the output signal are adjustable according to the present invention. FIG. 6 shows that the adjustable reference voltage is adjustable according to the present invention. When the power adaptor 10 (as a power supplier) and the electronic device 20 (as a power receiver) are coupled to each other through the cable 70, the I/O signal processing circuit 30 in the power adaptor 10 and/or the electronic device 20 can receive an input signal CC_IN or transmits an output signal CC_OUT (as shown in FIG. 4).

In the embodiment shown in FIG. 4, the level adjustable I/O circuit 32 includes an output driver 321 and an input comparator 323. Note that such an arrangement is to assume that the level adjustable I/O circuit 32 is a bidirectional circuit (which not only can receive the input signal but also can transmit the output signal). In different applications, the level adjustable I/O circuit 32 may unidirectionally receive the input signal or transmit the output signal. Under such circumstance, the level adjustable I/O circuit 32 can include the output driver 321 (for unidirectionally transmitting the output signal) without the input comparator 323, or include the input comparator 323 (for unidirectionally receiving the input signal) without the output driver 321.

The output driver 321 of the level adjustable I/O circuit 32 can transmit an output signal CC_OUT according to an output data Tx via the signal transmission line 72. One feature of the present invention is that the output driver 321 has an adjustable high operation voltage level V322 and an adjustable low operation voltage level V323, and the adjustment circuit 31 generates an adjustment signal AS according to the voltage drop related information, so as to correspondingly adjust the adjustable high operation voltage level V322 and/or the adjustable low operation voltage level V323. The adjustable high operation voltage level V322 determines a high level of the output signal CC_OUT (e.g., as shown by the high level VOH1 or the high level VOH2 in FIG. 5) and the adjustable low operation voltage level determines a low level of the output signal CC_OUT (e.g., as shown by the low level VOL1 or the low level VOL2 in FIG. 5). Note that the illustration in FIG. 5 is only for illustrative purpose, showing that the high or low level is adjustable. The relationship between the high level VOH1 and the high level VOH2 and the relationship between the low level VOL1 and the low level VOL2 can be different from illustrated (for example, the high level VOH1 can be lower than the high level VOH2 or the low level VOL1 can be higher than the low level VOL2; or, the difference between the high levels and the difference between the low levels can be different from each other; or, while one of the is unchanged, the other one of them is changed).

In prior art, for example, assuming that the level difference between the voltage VA and the voltage VB is 0.3V and the level difference between the grounding terminal GNDA and the grounding terminal GNDB is 0.3V, if the high/low level of a digit signal transmitted from the power adaptor 10 is 0.8V/0V, the high/low level of this very same digit signal, while being received by the electronic device 20, will be 0.5V/0.3V. If the electronic device 20 sets a value of 0.5V as the threshold voltage for differentiating a digital signal 0 from a digital signal 1, an undesirable misjudgment is likely to occur when there is a small noise is in the signal. However, in the present invention, the power adaptor 10 can transmit a digit signal having a high/low level of 1.1V/−0.3V instead of a digit signal having the original high/low level of 0.8V/0V, so that the high/low level of this very same digit signal, while being received by the electronic device 20, will be 0.8V/0V. Thus, the electronic device 20 can easily differentiate a digital signal 0 from a digital signal 1.

The input comparator 323 of the level adjustable I/O circuit 32 can receive an input signal CC_IN via the signal transmission line 72 and compare the input signal CC_IN with an adjustable reference voltage Vth, so as to generate an input data Rx. Another feature of the present invention is that: the adjustable reference voltage Vth is adjustable (e.g., as shown by Vth1 or Vth2 in FIG. 6), and the adjustment circuit 31 generates the adjustment signal AS according to the voltage drop related information, so as to correspondingly adjust the adjustable reference voltage Vth.

In prior art, for example, assuming that the level difference between the voltage VA and the voltage VB is 0.5V and there is no level difference between the grounding terminal GNDA and the grounding terminal GNDB, if the high/low level of a digit signal transmitted from the power adaptor 10 is 1V/0V, the high/low level of this very same digit signal, while being received by the electronic device 20, will be 0.5V/0V. If the electronic device 20 sets a value of 0.5V as the threshold voltage for differentiating a digital signal 0 from a digital signal 1, there is a high likelihood of misjudgment. However, in the present invention, the electronic device 20 can adjust the threshold voltage (i.e., the adjustable reference voltage Vth) to a lower value such as 0.3V, so that even though the digital signal has a high/low level of 0.5V/0V, the electronic device 20 can still easily differentiate a digital signal 0 from a digital signal 1.

Please refer to FIGS. 7A-7B as well as FIG. 8. FIGS. 7A-7B show embodiments of a voltage drop information generation circuit of the present invention. FIG. 8 shows another embodiment of a voltage drop information generation circuit of the present invention. The voltage drop information generation circuit can be located in the control circuit 12 or 22, or it can be a circuit external to the control circuit 12 or 22.

As shown in FIG. 7A, in one embodiment, the resistance of the resistor R1 of the positive power transmission line 71 is known. The voltage drop information generation circuit can include, for example but not limited to, a multiplier 51*a*. A current sense circuit 14 senses the current I flowing through the positive power transmission line 71 of the cable 70. The voltage drop related information can be determined based upon a product of multiplication of the known resistance of the resistor R1 (such resistance can be predetermined in the circuit) by the sensed value of the current I.

As shown in FIG. 7B, in another embodiment, the resistance of the resistor R2 of the negative power transmission line 73 is known. The voltage drop information generation circuit can include, for example but not limited to, a multiplier 51*b*. A current sense circuit 24 senses the current I flowing through the negative power transmission line 73 of the cable 70. The voltage drop related information can be determined based upon a product of multiplication of the known resistance of the resistor R2 (such resistance can be predetermined in the circuit) by the sensed value of the current I.

Or, as shown in FIG. 8, in still another embodiment, the voltage drop information generation circuit can include, for example but not limited to, a subtractor circuit 52. The subtractor circuit 52 can determine the voltage drop related information based upon a difference between a transmitted voltage V1 outputted from the power adaptor 10 (the power supplier 10) and a received voltage V2 received by the electronic device 20 (the power receiver 20). Under the circumstance where the I/O signal processing circuit 30 is in the power adaptor 10, the level of the transmitted voltage V1 is known to the power adaptor 10 itself, and the I/O signal processing circuit 30 can receive the information related to the received voltage V2 from the electronic device 20 via the signal transmission line 72. Under the circumstance where the I/O signal processing circuit 30 is in the electronic device 20, the I/O signal processing circuit 30 can employ a voltage sense circuit (for example but not limited to a resistor divider circuit) to sense the received voltage V2 and receives the information related to the transmitted voltage V1 from the power adaptor 10 via the signal transmission line 72.

The advantages of the present invention include that: the present invention can generate the adjustment signal AS according to the voltage drop related information, so as to adjust the input signal or the output signal. On one hand, the level adjustable I/O circuit 32 can correspondingly adjust the adjustable high operation voltage level V322 and the adjustable low operation voltage level V323 according to the adjustment signal AS, so that the level of the output signal CC_OUT can be adjusted. On the other hand, the level adjustable I/O circuit 32 can correspondingly adjust the adjustable reference voltage Vth according to the adjustment signal AS, so that the comparison level of the input signal CC_IN can be adjusted, to thereby ensure the accuracy of the input data Rx received by the electronic device 20.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. In view of the foregoing, the spirit of the present invention should cover all such and other modifications and variations, which should be interpreted to fall within the scope of the following claims and their equivalents.

What is claimed is:

1. An input/output (I/O) signal processing circuit for signal transmission between a power supplier and a power receiver, wherein the power supplier and the power receiver are connected to each other through a cable, the cable including positive and negative power transmission lines and a signal transmission line, the I/O signal processing circuit being used for receiving an input signal or transmitting an output signal via the signal transmission line, the I/O signal processing circuit comprising:

a level adjustable input/output (I/O) circuit, which includes:
an output driver for transmitting the output signal via the signal transmission line according to an output data, the output driver having an adjustable high operation voltage level and an adjustable low operation voltage level, wherein the adjustable high operation voltage level determines a high level of the output signal and the adjustable low operation voltage level determines a low level of the output signal; and
an input comparator for receiving the input signal via the signal transmission line and comparing the input signal with an adjustable reference voltage, so as to generate an input data; and an adjustment circuit for generating an adjustment signal according to voltage drop related information which is related to a voltage drop across the positive or negative power transmission line, so as to correspondingly adjust the adjustable high operation voltage level and the adjustable low operation voltage level, and to correspondingly adjust the adjustable reference voltage.

2. The I/O signal processing circuit of claim 1, wherein the voltage drop related information is generated by a voltage drop information generation circuit, the voltage drop information generation circuit including a multiplier, which determines the voltage drop related information based upon a product of multiplication of a predetermined resistance product by a sensed value of a current flowing through the positive or negative power transmission line.

3. The I/O signal processing circuit of claim 1, wherein the voltage drop related information is generated by a voltage drop information generation circuit, the voltage drop information generation circuit including a subtractor circuit, which determines the voltage drop related information based upon a difference between a transmitted voltage outputted from the power supplier and a received voltage received by the power receiver.

4. The I/O signal processing circuit of claim 3, wherein the I/O signal processing circuit is located within the power supplier and the I/O signal processing circuit receives information related to the received voltage from the power receiver via the signal transmission line.

5. The I/O signal processing circuit of claim 3, wherein the I/O signal processing circuit is located within the power receiver and the I/O signal processing circuit receives information related to the transmitted voltage from the power supplier via the signal transmission line.

6. An input/output (I/O) signal processing method for a signal transmitted between a power supplier and a power receiver, wherein the power supplier and the power receiver are connected to each other through a cable, the cable including positive and negative power transmission lines and a signal transmission line, the I/O signal processing method comprising the steps of:

receiving an input signal or transmitting an output signal between the power supplier and the power receiver via the signal transmission line, wherein a high level of the output signal is determined by an adjustable high operation voltage level and a low level of the output signal is determined by an adjustable low operation voltage level, and the input signal is compared with an adjustable reference voltage; and generating an adjustment signal according to voltage drop related information which is related to a voltage drop across the positive or negative power transmission line, so as to correspondingly adjust the adjustable high operation voltage level and the adjustable low operation voltage level, and to correspondingly adjust the adjustable reference voltage.

7. The I/O signal processing method of claim 6, wherein the voltage drop related information is determined according to a product of multiplication of a predetermined resistance multiplied by a sensed value of a current flowing through the positive or negative power transmission line.

8. The I/O signal processing method of claim 6, wherein the voltage drop related information is determined according to a difference between a transmitted voltage outputted from the power supplier and a received voltage received by the power receiver.

9. The I/O signal processing method of claim 8, further comprising:

receiving information related to the received voltage from the power receiver via the signal transmission line.

10. The I/O signal processing method of claim 8, further comprising:

receiving information related to the transmitted voltage from the power supplier via the signal transmission line.

* * * * *